United States Patent
Voelkel et al.

(10) Patent No.: US 9,435,837 B2
(45) Date of Patent: Sep. 6, 2016

(54) SENSOR AND METHOD FOR DETECTING AN OBJECT

(71) Applicant: PEPPERL + FUCHS GmbH, Mannheim (DE)

(72) Inventors: Hardi Voelkel, Viernheim (DE); Jochen Vater, Mannheim (DE)

(73) Assignee: PEPPERL + FUCHS GmbH, Mannheim (DE)

( * ) Notice: Subject to any disclaimer, the term of this patent is extended or adjusted under 35 U.S.C. 154(b) by 291 days.

(21) Appl. No.: 13/847,126

(22) Filed: Mar. 19, 2013

(65) Prior Publication Data
US 2013/0249570 A1    Sep. 26, 2013

(30) Foreign Application Priority Data
Mar. 20, 2012   (EP) .................................. 12001938

(51) Int. Cl.
| | | |
|---|---|---|
| *G01R 27/26* | (2006.01) | |
| *H03K 17/955* | (2006.01) | |
| *H03K 17/96* | (2006.01) | |

(52) U.S. Cl.
CPC ......... *G01R 27/2605* (2013.01); *H03K 17/955* (2013.01); *H03K 17/962* (2013.01); *H03K 2217/960705* (2013.01)

(58) Field of Classification Search
CPC .. G01R 27/26; G01R 27/2605; H03K 17/96; H03K 17/955; H03K 2217/960705
See application file for complete search history.

(56) References Cited

U.S. PATENT DOCUMENTS 5,535,273 A * 7/1996 Kausel ................. H03F 1/0222
379/399.01
5,801,340 A * 9/1998 Peter .......................... 178/20.04
2011/0084709 A1* 4/2011 Asjes et al. .................... 324/658

FOREIGN PATENT DOCUMENTS

| DE | 102005041113 A1 | 3/2007 |
|---|---|---|
| DE | 102009045967 B3 | 6/2011 |
| EP | 1214787 | 6/2002 |
| GB | 2307609 A | 11/1995 |
| WO | 2009150618 A2 | 12/2009 |

OTHER PUBLICATIONS

Simon, Application No. EP 12 00 1938, European Search Report, Nov. 16, 2012, 2 pages.

* cited by examiner

*Primary Examiner* — Son Le
(74) *Attorney, Agent, or Firm* — Hoffman Warnick LLC (57) ABSTRACT

The invention relates to a sensor for detecting an object. The sensor includes a probe electrode for forming a measuring capacitance with the object to be detected, a charging generator for generating an alternating charging voltage, wherein the probe electrode is charged by means of the alternating charging voltage, an amplifier for amplifying a voltage across the measuring capacitance, wherein the amplifier includes a first supply connection and a second supply connection, electronic means for processing signals outputted at an output of the amplifier to form at least one output signal and at least one sensor output for outputting the at least one output signal. According to the invention, the sensor is characterized in that a DC voltage in the form of a second supply voltage is connectable to the second supply connection, and that a first supply voltage having an AC voltage portion is connectable to the first supply connection, wherein a supply voltage generator is available for generating the DC voltage portion. The invention also relates to a method for detecting an object.

19 Claims, 4 Drawing Sheets

SENSOR AND METHOD FOR DETECTING AN OBJECT

TECHNICAL FIELD

The present invention relates, in a first aspect, to a sensor for detecting an object. In a second aspect, the invention relates to a method for detecting an object.

RELATED ART

A generic sensor comprises a probe electrode for forming a measuring capacitance with the object to be detected, a charging generator for generating an alternating charging voltage by means of which the probe electrode is charged, an amplifier for amplifying a voltage across the measuring capacitance, wherein the amplifier includes a first supply connection and a second supply connection, electronic means for processing signals that are outputted at an output of the amplifier to form at least one output signal, and at least one sensor output for outputting the at least one output signal.

In a generic method for detecting an object, a measuring capacitance is formed by means of a probe electrode and the object to be detected. The probe electrode is charged by means of an alternating charging voltage, a voltage across the measuring capacitance is amplified by an amplifier, and signals that are outputted at the output of the amplifier are processed to form at least one output signal and the at least one output signal is outputted.

Such a method and a generic sensor are disclosed in EP 1 214 787 B1. In this method, an AC voltage source is connected to both supply connections of the amplifier. The supply voltage of the amplifier thus remains constant. While both the measuring electrode and the supply connections of the amplifier are connected to the AC voltage source, it is possible to detect variations in the capacitance between the probe electrode and the target object.

SUMMARY

According to an aspect of the invention, a sensor for detecting an object is provided. The sensor, with its cost-effective design, operates with particular accuracy and resistance against interferences.

According to another aspect of the invention, a method for detecting an object is provided. The method achieves, at minimum expense, highly accurate measurements largely unaffected by interferences.

According to the invention, provision is made for a second supply voltage to be connectable in the form of a DC voltage to the second supply connection of a sensor of the aforementioned generic type and for a first supply voltage having an AC voltage portion to be connectable to the first supply connection, a supply voltage generator being available for generating the AC voltage portion.

In the method of the aforementioned generic type, provision is made, according to the invention, for a second supply voltage in the form of a DC voltage to be connected to a second supply connection of the amplifier, and for a first supply voltage having an AC voltage portion to be connected to a first supply connection of the amplifier, the AC voltage portion being generated by a supply voltage generator.

The method of the invention may be executed using the sensor of the invention.

The measuring principle of the sensor of the invention is based on the fact that the voltage across the measuring capacitance created by the alternating charging voltage does not immediately jump to a constant value, but instead a charging and a discharging take place, the time constants of which are a function of the level of the measuring capacitance. The greater the measuring capacitance, the longer the charging and the discharging take. Thus, it is possible to deduce the magnitude of the measuring capacitance from the voltage across the measuring capacitance or from a temporal mean value of this voltage. The magnitude of the measuring capacitance in turn depends on the distance from the object to be detected. Thus it is possible to detect an object by measuring the voltage across the measuring capacitance.

The invention is based on the cognition that it is possible to increase the measuring accuracy when there is a minimum of active parasitic capacitances that influence charging of the measuring capacitance.

The present invention is configured to deactivate a parasitic capacitance occurring between the first supply connection and the input of the amplifier. This is achieved, according to the present invention, by the application of a supply voltage having an AC voltage portion at the first supply connection. A parasitic capacitance retards the charging and discharging process at the measuring capacitance, thereby altering the temporal mean value of the voltage across the measuring capacitance. A voltage surge is generated across the parasitic capacitance at the amplifier input and therefore at the measuring capacitance by the AC voltage portion, which parasitic capacitance forms, together with the measuring capacitance, a voltage divider. The voltage surge alters the temporal mean value of the voltage across the measuring capacitance just sufficiently to compensate the effect of the parasitic capacitance. Thus, a temporal mean value of the voltage across the measuring capacity is advantageously not dependent on the magnitude of the parasitic capacitance.

In the present invention, the AC voltage portion is applied only at the first supply connection. However, only a DC voltage is applied at the second supply connection. With transistor amplifiers, in particular, there is no active parasitic capacitance between the second supply connection and the amplifier input, as a result of which an AC voltage portion is not required at this connection for compensating a parasitic capacitance. The use of a DC voltage at the second supply connection makes for a particularly cost effective design, with which very accurate measurements are nevertheless possible and which is not, or only slightly, affected by parasitic capacitances. Unlike known sensors therefore, the supply voltage of the amplifier, being the difference between the voltages at the two supply connections of the amplifier, is according to the present invention not constant, but instead is varied periodically, for example, by a square wave voltage.

In practical implementations it is possible only with comparatively great time and effort to prevent minor DC voltage fluctuations. Therefore, the terms "DC voltage" or "DC voltage potential" to be applied at the second supply connection should be taken to mean any potential, the value of which varies during operation by not more than 10% and preferably by not more than 5% from, in particular, the minimum supply voltage of the amplifier.

A voltage supply can be available for generating the DC voltage to be applied at the amplifier as the second voltage supply. The voltage supply means may differ from, or be independent of, the supply voltage generator used to generate the AC voltage portion. In principle, it is possible for one and the same voltage supply to deliver the second supply voltage and the AC voltage portion.

The object to be detected can be an object of basically any desirable material. For example, it can be a sheet of paper, a wooden palette, a metallic object, a liquid, or a bulk material disposed, for example, in the toner cartridge of a printer. For the method of the invention the object may be grounded, such that, in particular, the electrical potential of the object is equal to ground potential.

To render the parasitic capacitance between the first supply connection and the amplifier input harmless, the AC voltage portion of the first supply voltage should match as closely as possible in frequency and phase the alternating charging voltage used to charge the probe electrode. For this purpose, provision is made, in a variant of the sensor of the invention, for the charging generator and the supply voltage generator to be formed by one and the same generator, and for the AC voltage portion of the first supply voltage to be defined by the alternating charging voltage. In addition, the use of a single generator makes for a particular cost-effective sensor design.

In another embodiment of the sensor of the invention, the amplitude of the AC voltage portion of the charging voltage deviates at most by 20% from the amplitude of the AC voltage portion of the first supply voltage. When using a single generator, this voltage deviation can be caused, for example, due to additional diodes or resistors.

The supply voltage at the first supply connection may comprise a DC voltage portion. The latter differs sufficiently from ground potential for the voltage between the two supply connections to be high enough at any time to operate the amplifier within its operating range.

The DC voltage portion may have a value of, say, from 2V to 20V. In particular, the DC voltage portion can be selected such that the first supply voltage of the amplifier varies between 5V and 10V.

Particularly good measuring accuracy can be achieved when the amplitude of the AC voltage portion is as high as possible.

It is advantageous when the second supply voltage applied at the second supply connection is equal to ground potential.

In an embodiment of the sensor of the invention, in order to inhibit the occurrence of a parasitic capacitance between the second supply connection and the amplifier input of the amplifier, the amplifier is a transistor amplifier in common collector circuit, more particularly a common collector Darlington circuit or a complementary collector Darlington circuit. The second supply connection at which the DC voltage is applied can be either the positive or the negative supply connection, depending on the design of the amplifier. When using an npn transistor amplifier, the second supply voltage is a constant negative supply voltage, whereas the first supply voltage is a positive supply voltage having an AC voltage portion. Conversely, when using a pnp transistor amplifier, the second supply voltage is a constant positive supply voltage and the first supply voltage having the AC voltage portion is a negative supply voltage. Furthermore, it is alternatively possible to employ a normal or complementary Darlington circuit in npn or pnp design.

Bipolar transistors may be used, although it is basically possible to use field effect transistors.

In an embodiment, the amplifier has an AC voltage gain of 1,in order to prevent interference effects of a parasitic capacitance between the output and input of the amplifier, that is to say, it is operated as an impedance converter. In this embodiment, it is advantageous when all parasitic capacitances between the output and input of the amplifier are deactivated.

The voltage across the measuring capacitance can be evaluated by determining temporal mean values of the voltage during charging and discharging of the measuring capacitance. To accomplish this, provision is made, in a design variant of the sensor of the invention, for the electronic means to comprise a rectifier circuit for the purpose of rectifying a signal at the output of the amplifier, and for the first supply voltage of the amplifier to be used as the reference potential for the rectifier circuit.

Such a rectified signal is just equal to the temporal mean value of the voltage at the measuring capacitance. It is significant in this regard that rectification is performed separately for charging and for discharging. For this purpose, provision can be made for the rectifier circuit to be a synchronous rectifier circuit and for the synchronous rectifier circuit to be controlled by the charging voltage. In addition, it is advantageous when the voltage drop associated with rectification is particularly small in a synchronous rectifier having analog switches or field effect transistors.

Advantageously, provision may be made for the electronic means to be set for generating an analog output signal or a switching signal from voltage mean values that are outputted by the rectifier circuit, and for the analog output signal or the switching signal to be outputted at the sensor output. The analog output signal can, for example, be a difference of the two voltage mean values which correspond to the charging and discharging of the measuring capacitance.

The switching signal can be obtained, for example, by comparing the voltage mean values with threshold values or by comparing the difference between the two voltage mean values with the threshold value. To accomplish this, provision may be made for the electronic means to comprise a first comparator for comparing the output signal of the rectifier circuit with a threshold value, and for outputting, at the sensor output, a switching signal that is derived from the switching signal of the first comparator.

A cost-effective sensor design is achieved when the reference potential for the output of the first comparator is the first supply voltage, when a second comparator is present which uses the ground potential as the reference potential for its output, and when the switching signal of the first comparator is outputted to the second comparator such that the output of the second comparator does not alternate with the pulse of the charging voltage. For this purpose, a signal transmission circuit may be provided which transmits the switching signal of the first comparator to the second comparator. In this configuration, the signal transmission circuit relates the switching signal of the first comparator to a DC voltage potential, more particularly to ground potential, so that the output signal of the second comparator does not alternate with the frequency of the charging voltage.

In an embodiment of the method of the invention, each of the oscillation periods of the alternating charging voltage comprises a first and a second charge phase. During the first charge phase the measuring capacitance is charged, whereas it is discharged during the second charge phase. The alternating charging voltage can, for example, have a square wave shape with which the first and second charge phases are formed by the two different constant voltage levels of the square wave voltage. In an embodiment, provision can be made for a rectifier circuit to output a voltage mean value for one or both of the charge phases, or for a rectifier circuit to output an output signal which is derived from the voltage mean values of the two charge phases. Such an output signal is a function of the magnitude of the measuring capacitance and therefore provides information concerning the object to be detected.

In embodiments of the method of the invention, as described below, it is possible to further improve the interference immunity to external influences: When an external interfering component couples capacitively to the amplifier input, it changes the voltage at that input. As long as a parasitic frequency of this component is not synchronous with the operating pulse of the rectifier, there is on average no change in the rectifier output voltage thereof, so that the measurement is not disrupted. If, however, the parasitic frequency is synchronous with the operating pulse of the rectifier, the rectifier output voltage is changed, thereby distorting the measurement. These interfering signals can be masked by generating the alternating charging voltage so as to vary in frequency and/or phase. Then, when evaluating the mean values at varying frequencies or phases of the charging voltage, the effects of a parasitic component at a constant parasitic frequency and phase are advantageously masked. In this way, it is possible to discern with even greater reliability objects that are to be detected.

BRIEF DESCRIPTION OF THE DRAWINGS

Further advantages and features of the invention are described below with reference to the appended schematic figures.

In general, identical elements or elements acting equivalently are identified in the figures by the same reference numerals or characters.

DETAILED DESCRIPTION OF THE INVENTION

Figure 1:
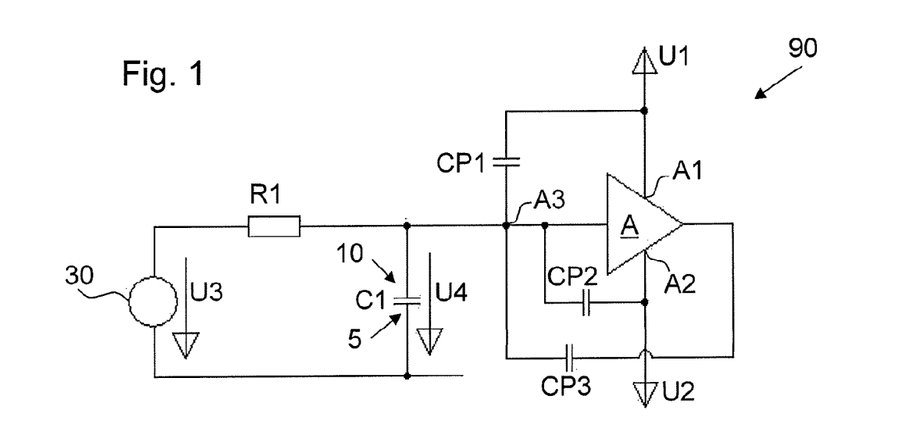
FIG. 1 is a schematic circuit diagram of a generic sensor.

FIG. 1 is a schematic circuit diagram of a generic sensor 90. The sensor 90 comprises a probe electrode 10 and an amplifier A.

The probe electrode 10 and an object 5 to be detected together form a measuring capacitance C1. The magnitude of the measuring capacitance C1 is influenced by the position and type of object 5, and it is thus possible to deduce from the measuring capacitance C1 the presence of the object 5 as well as the distance from the object 5.

The sensor 90 further comprises a charging generator 30, which charges the probe electrode 10 with an alternating charging voltage U3 through a charging resistor R1. The target object 5 is on the other hand at ground potential.

The effects of the alternating charging voltage U3 and the resultant AC voltage between the probe electrode 10 and the target object 5 are explained below with reference to FIGS. 2 and 3.

Figure 2:
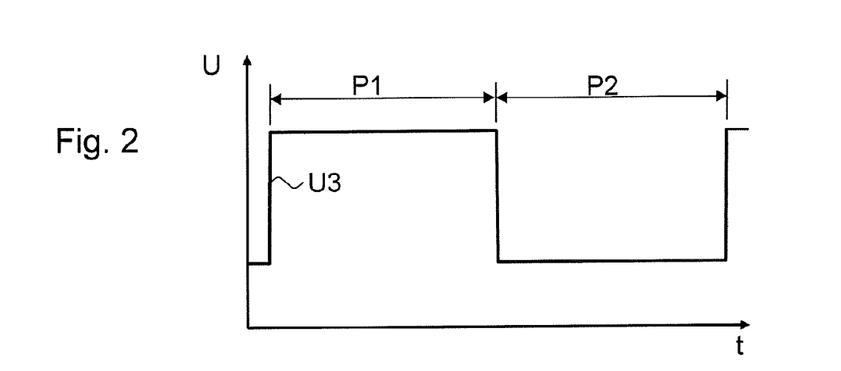
FIG. 2 is a graph of the alternating charging voltage which supplies the probe electrode, in relation to time.

FIG. 2 shows a graph in which the alternating charging voltage U3 is diagrammatically plotted on the ordinate U against time t along the abscissa. The alternating charging voltage U3 has a square wave shape, in which a period of the charging voltage U3 comprises at least one first and one second charge phase P1, P2 at different electrical potentials.

Figure 3:
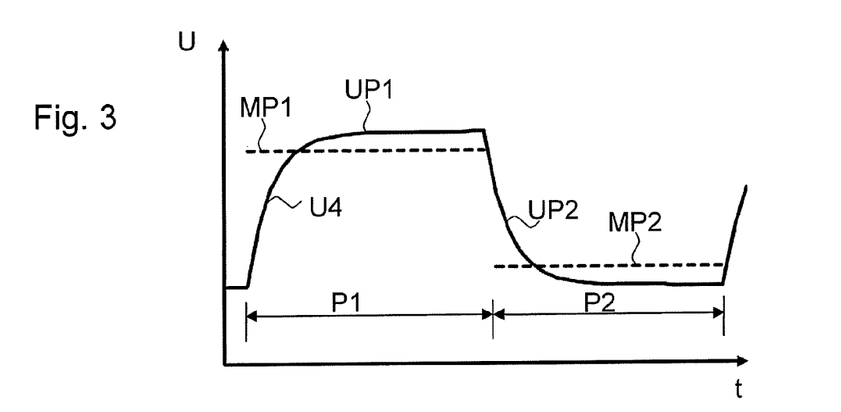
FIG. 3 is a graph of an idealized AC voltage between the probe electrode and an object to be detected when no parasitic capacitances occur.

As a result of the alternating charging voltage U3, an AC voltage U4 is present between the probe electrode 10 and the object 5, which is shown schematically in FIG. 3 as a function of time t. During the first charge phase P1, the probe electrode 10 is charged to a high voltage level relative to the object 5, as indicated by the curve UP1. During this phase the temporal curve of the AC voltage U4 is flattened, not square. The greater the measuring capacitance C1, the greater is the time constant of the charging process, that is to say, the flatter is the slope of the curve UP1. In the second charge phase P2, the AC voltage U4 at the probe electrode 10 drops to a lower value, as indicated by the curve UP2. Here, too, the curve UP2 is flattened as a function of the magnitude of the measuring capacitance C1.

In addition, FIG. 3 shows the mean values MP1 and MP2 of the AC voltage U4 during the charge phases P1 and P2. The greater the measuring capacitance C1, the flatter are the curves UP1 and UP2, and the shorter is the distance between the two mean values MP1 and/or MP2. Thus it is possible to deduce the presence or the distance of an object 5 from the mean values MP1 and MP2, or alternatively from the difference between MP1 and MP2.

In order to determine as accurately as possible the AC voltage U4 or its temporal mean value, the probe electrode 10 is connected to an input of the amplifier A. In conventional sensors 90 and methods of measurement, the amplifier A can cause parasitic effects, as is discussed with reference to FIG. 1.

The amplifier A has a first supply connection A1 at which a first supply voltage U1 is applied, and a second supply connection A2 at which a second supply voltage U2 is applied.

Depending on the design of the amplifier A, a parasitic capacitance CP1 is present between the first supply connection A1 and the input A3 of the amplifier A and/or a parasitic capacitance CP2 is present between the second supply connection A2 and the input A3. In addition, another parasitic capacitance arises between the output of the amplifier A and the input A3.

If both the first supply voltage U1 and the second supply voltage U2 are each a DC voltage, then the parasitic capacitances are active. The probe electrode 10 is connected to the input A3 of the amplifier, as are the parasitic capacitances CP1, CP2, and CP3. For that reason, charging of the measuring capacitance C1 formed by the probe electrode 10 and the object 5 is affected by the parasitic capacitances CP1, CP2, and CP3. Consequently, this changes the temporal curve of the AC voltage U4 across the measuring capacitance C1.

Figure 4:
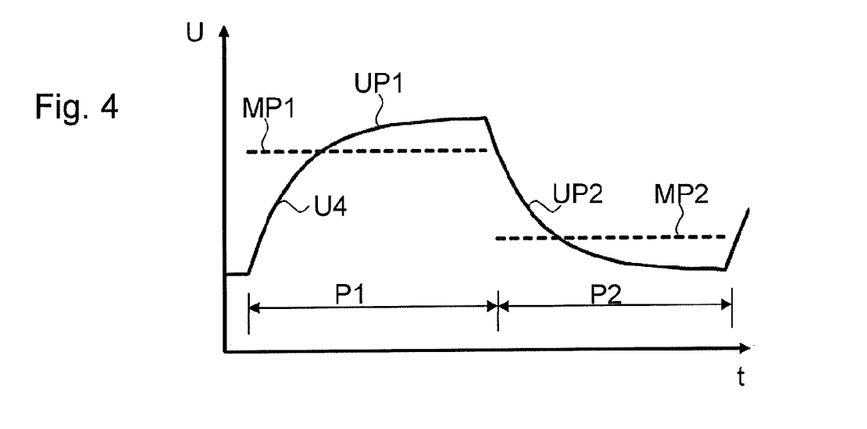
FIG. 4 is a graph of an AC voltage between the probe electrode and the object, in which the curve of the AC voltage is affected by parasitic capacitances.

FIG. 4 shows a graph in which the AC voltage U4 is plotted diagrammatically against time t. As a result of the effects of the parasitic capacitances CP1, CP2 and CP3, the curve of the AC voltage U4 is flattened to a greater extent than the drop shown in FIG. 3. Thus, the distance is shortened between the mean values MP1 and MP2 of the AC voltage U4 during both charge phases P1 and P2. The parasitic capacitances CP1, CP2, and CP3 therefore influence the mean values MP1 and MP2. Thus, any inference concerning the magnitude of the measuring capacitance 10, and thus concerning the presence or distance of an object 5, will be distorted.

According to the present invention, the effect of the parasitic capacitances CP1, CP2, and CP3 is neutralized to the greatest possible extent, leaving the measuring results unaffected, or only barely affected, by the parasitic capacitances CP1, CP2, and CP3.

Figure 5:
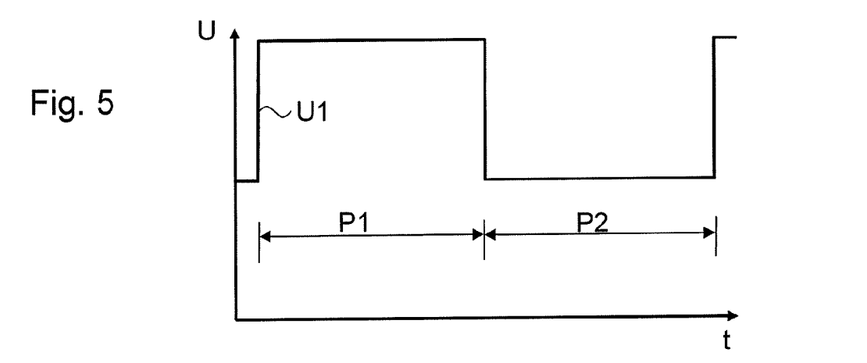
FIG. 5 is a graph of a first supply voltage, which is applied at a first supply connection of an amplifier of a sensor of the invention.

The effect of the parasitic capacitance CP1 is neutralized by the following measure:

A supply voltage U1 having an AC voltage portion is applied at the first supply connection A1 of the amplifier A. A graph of such a supply voltage U1 is shown in FIG. 5. The AC voltage portion of the supply voltage U1 has a square wave shape and matches the charging voltage in terms of period length, amplitude and phase. In addition, the supply voltage U1 comprises a DC voltage portion, the value of which is selected sufficiently high to operate the amplifier A.

Figure 6:
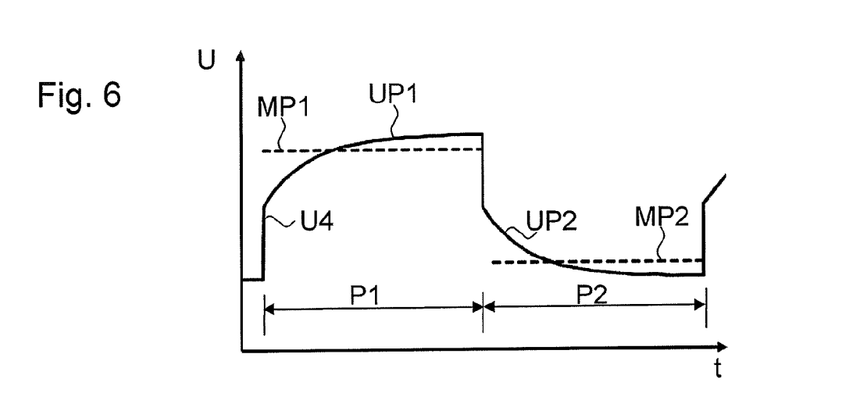
FIG. 6 is a graph of an AC voltage which is applied between the probe electrode and the object, a parasitic capacitance being present between the input of the amplifier and the first supply voltage having an AC voltage portion.

This alternating first supply voltage U1 changes the curve of the AC voltage U4 at the probe electrode 10. FIG. 6 shows the curve of the AC voltage U4, in which again an ascending segment UP1 of the AC voltage U4 is present during the first charge phase P1, whereas a descending section UP2 of the AC voltage U4 is present during the second charge phase P2. A capacitive voltage divider is formed by the parasitic capacitance CP1 and the measuring capacitance. At the transitions between the charge phases P1 and P2, the first supply voltage of the amplifier U1 initiates in each case a voltage surge. The voltage surge of U1 is coupled to the measuring capacitance with the division factor of the capacitive voltage divider.

In this way, the mean value MP1 is raised during the first charge phase P1. The lowering of the mean value MP1 as a result of the parasitic capacitance CP1, as described with reference to FIG. 4, is thus sufficiently compensated to achieve that the parasitic capacitance CP1 has no disruptive effect on the mean value MP1.

Similarly, the surge occurring during the second charge phase P2 causes the mean value MP 2 to drop, which drop also compensates any effect of the parasitic capacitance CP1 on the mean value MP2 during the second charge phase P2.

In this way, it is advantageously possible to draw very accurate conclusions on the measuring capacitance and thus on the presence and/or position of an object.

Figure 7:
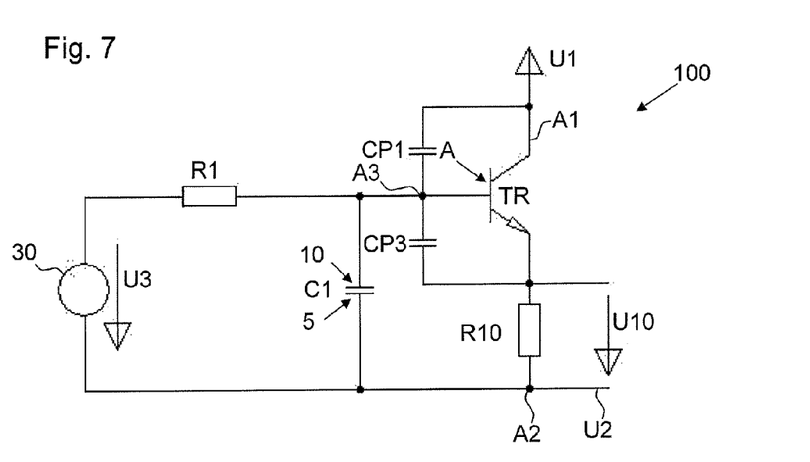
FIG. 7 is a schematic circuit diagram of an exemplary embodiment of a sensor of the invention.

The following measure is taken to inhibit the parasitic capacitance CP2:

FIG. 7 shows a schematic circuit diagram of a sensor 100 of the present invention. As described with reference to the sensor 90 shown in FIG. 1, a measuring capacitance is again formed by a probe electrode 10 and an object 5 to be detected. Likewise, a charging voltage U3 is connected to the measuring capacitance C1 through a charging resistor R1.

In this embodiment, the amplifier A is in the form of a transistor amplifier. It comprises a bipolar transistor TR, in this case an npn-transistor and a resistor R10. The probe electrode 10 is connected to the base of the transistor TR. The resistor R10 is connected to the emitter of the transistor TR. The other side of the resistor R10 and the object 5 to be detected are grounded. The voltage U10 drops across the resistor R10 to a value dependent on the AC voltage U4 between the probe electrode 10 and the object 5.

The first supply voltage U1, which in the present embodiment is a positive supply voltage, is applied at the collector of the transistor TR. This supply voltage has a DC voltage portion and an AC voltage portion, as shown in FIG. 5.

Each integrated amplifier has a parasitic capacitance CP2 between the input and the negative supply voltage. That is not the case with the transistor amplifier described here. Therefore, it is not necessary to neutralize the effect of CP2. For that reason, the negative supply voltage can remain constant, i.e., in the present case, connected to ground potential.

In a further embodiment (not shown) the transistor is a pnp transistor. In this case, there is no parasitic capacitance between the positive supply voltage and the amplifier input, but there is one between the negative supply voltage and the amplifier input. In this case, therefore, the first supply voltage, which comprises the AC voltage portion, is the negative supply voltage of the transistor. The positive supply voltage is on the other hand a DC voltage.

In an alternative design variant, the amplifier A is formed by a Darlington circuit or complementary Darlington circuit, again using either an npn or a pnp design.

The effect of the parasitic capacitance CP3 is neutralized by the following measure:

The amplifier A has an AC voltage gain of 1. No current is able to flow as a result of a parasitic capacitance CP3 between the input and output of the amplifier. The capacitance CP3 has no effect.

Figure 8:
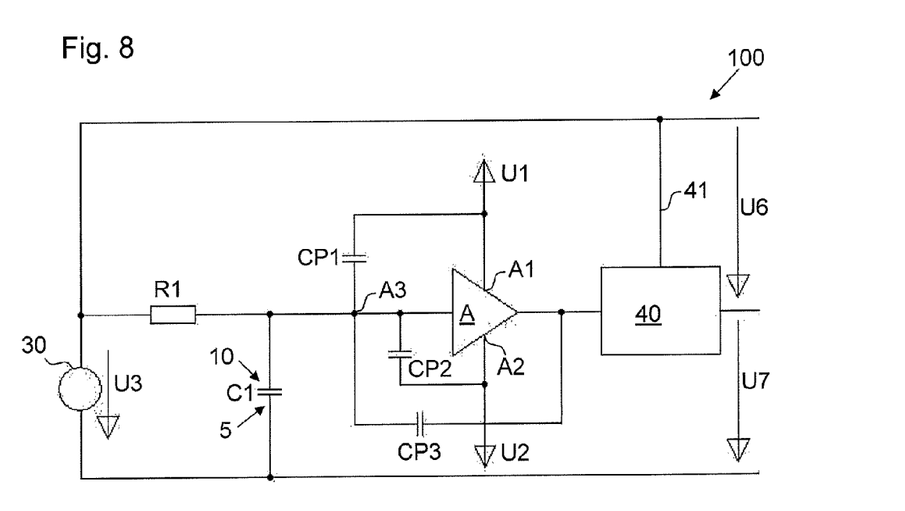
FIG. 8 is a schematic circuit diagram of a second exemplary embodiment of a sensor of the invention.

FIG. 8 shows another exemplary embodiment of a sensor 100 of the invention.

This sensor is again largely of the same design as the sensor 90 shown in FIG. 1. Unlike the sensor 90, however, the first supply voltage U1 has an AC voltage portion, whereas the second supply voltage U2 is a DC voltage.

The embodiment shown in FIG. 8 additionally includes a rectifier circuit 40 connected to the output of the amplifier A. The rectifier circuit 40 is in this case a synchronous rectifier controlled by the charging voltage via a control signal 41. The mean voltage value across the measuring capacitance is outputted at the output of the rectifier circuit 40 for each of the first and second charge phases P1 and P2 of the charging voltage. Thus, the synchronous rectifier outputs the voltage mean values MP1 and MP2 shown in FIG. 6, or voltages proportional to these mean values.

Alternatively, the rectifier 40 can be configured such that only one of the voltage mean values MP1 and MP2 is outputted.

The negative or positive supply voltage of the amplifier or a reference potential derived therefrom can be selected as the reference potential for the rectifier circuit 40. The rectifier voltage U6 and rectifier voltage U7 are shown in FIG. 8 by way of example.

As an alternative to the rectifier circuit 40 described, a rectifier having two outputs may be present, at which outputs the two mean values MP1 and MP2 or signals corresponding thereto can be outputted.

In a further alternative, the difference between the mean values MP1 and MP2 or the difference between signals corresponding to these mean values is outputted at one output of the rectifier circuit 40.

The output voltage of the rectifier circuit 40 can be evaluated in different ways. For example, by means of the amplifier it is possible to amplify, shift, scale and/or linearize the output voltage of the rectifier circuit 40 and subsequently output it at an output of the sensor 100.

Alternatively, the output voltage of the rectifier circuit 40 can be supplied to an analog-digital converter and subsequently processed with the aid of a microprocessor to form an output signal, which can in turn be outputted as an analog signal or as a switching signal.

It is further possible to compare the output voltage of the rectifier circuit 40 with a threshold voltage using a comparator. A schematic circuit diagram of such an embodiment of a sensor 100 of the invention is shown in FIG. 9.

Figure 9:
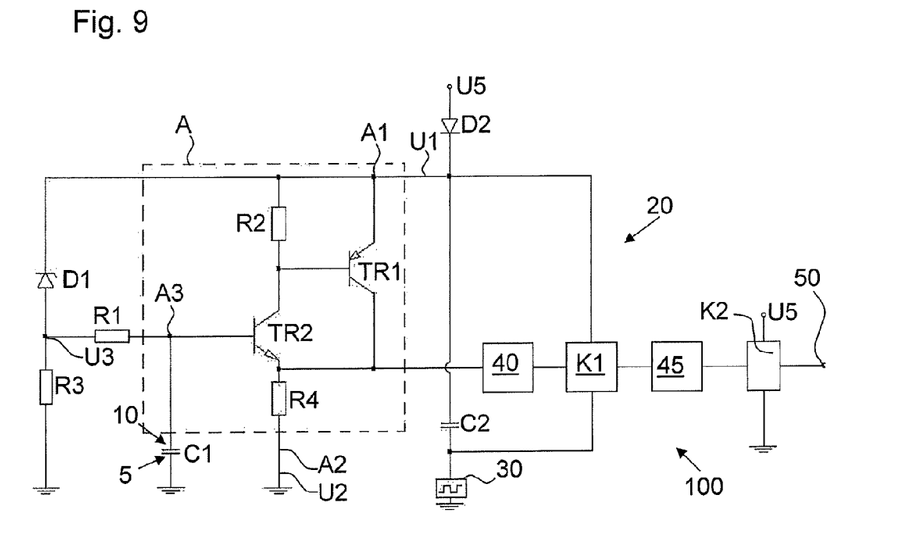
FIG. 9 is a schematic circuit diagram of a third exemplary embodiment of a sensor of the invention.

FIG. 9 depicts components of the sensor 100 of the invention, particularly the amplifier A, the probe electrode 10, the rectifier circuit 40, and a generator 30.

The generator 30 generates an AC voltage which alternates, for example between 0V and 5V, in square waves. This voltage is used both for charging the probe electrode and for supplying voltage to the amplifier. Thus, the generator 30 simultaneously functions as a charge generator and a supply voltage generator. This generator or frequency generator 30 is connected through a hold capacitor C2 to the first supply connection A1 of the amplifier A. Also connected to the first supply connection A1 through a diode D2 is a DC voltage supply U5.

As a result, the first supply connection A1 assumes the voltage level of the DC voltage supply U5 during a negative half-wave of the AC voltage of the frequency generator 30. This value can be lowered slightly by a drop in potential across the diode D2.

In addition, during the negative half-wave of the AC voltage of the frequency generator 30, the hold capacitor is charged by the DC voltage supply U5. During a positive half-wave of the AC voltage of the frequency generator 30 a voltage is generated at point A1 that corresponds to the sum of the DC voltage of the DC voltage supply U5 and the AC voltage amplitude of the frequency generator 30. The amplitude of the AC voltage of the frequency generator 30 may be equal to the DC voltage level of the DC voltage supply U5, with the result that the voltage is doubled at point A1. If, for example, the DC voltage supply U5 supplies 5V and the AC voltage of the frequency generator 30 alternates between 0V and 5V, then a supply voltage that alternates between 5V and 10V will be present at the first supply connection A1, cf. FIG. 6.

The second supply connection A2 is grounded and is therefore at 0V. An AC voltage does not have to be applied at the second supply connection A2, since, on account of the design of the amplifier A, there is no parasitic capacitance to be compensated between the amplifier input A3 and the second supply connection A2.

An embodiment of the amplifier A is shown in detail in FIG. 9. It comprises a complementary Darlington circuit having a pnp transistor TR1 and a npn transistor TR2. The supply voltage having the AC voltage portion is applied at the emitter of the pnp transistor TR1. A resistor R2 is disposed parallel to the emitter and base of the pnp transistor TR1. The collector of the npn transistor TR2 is connected to the base of the pnp transistor TR1. The emitter of the npn transistor TR2 is connected to the collector of the pnp transistor TR1.

The probe electrode 10 is connected to the base of the npn transistor TR2. This connection is designated by A3 in FIG. 9 as the amplifier input.

At this point the charging voltage of the probe electrode 10 is derived from the first supply voltage of the amplifier. Thus, it is advantageously possible to achieve a match between the charging voltage and the first supply voltage in terms of frequency and phase, in a cost-effective design.

To this end, the first supply connection of the amplifier at which the first supply voltage is present, is connected through a Zener diode D1 and a resistor R1 to the probe electrode 10 and to the amplifier input A3. Connected between the Zener diode D1 and the resistor R1 is a further resistor R3 which is connected to ground.

The voltage outputted by the amplifier A is passed to the rectifier circuit 40, in which case the amplifier's first supply voltage having the AC voltage portion or a reference potential derived therefrom serves as the reference potential for the output of the amplifier.

Furthermore, the amplifier's first supply voltage having the AC voltage portion is the reference potential for the rectified output voltage outputted by the rectifier circuit 40.

This rectified output voltage is passed to a comparator K1 which compares the rectified output voltage with an adjustable reference voltage. If the output voltage is lower than the reference voltage, then the voltage supplied by the frequency generator 30 will be outputted as a switching signal, that is to say, in the example, a voltage of 0V or 5V depending on the charge phase P1 or P2. Conversely, if the rectified output voltage is higher than the reference voltage, then the voltage applied at the first supply connection of the amplifier will be outputted as a switching signal, i.e., in the present example, 5V or 10V. The operating direction of the comparator may be reversed, in which case the voltage supplied by the frequency generator 30 will be outputted as a switching signal when the reference voltage is lower than the output voltage of the rectifier.

Connected to the output of the comparator K1 is a signal transmission circuit 45, which relates the switching signal outputted by the comparator K1 to ground, that is, 0V.

The signal transmission circuit 45 is followed by a second comparator K2 which compares the switching signal coming from the signal transmission circuit 45 with a threshold value and, depending on the result of the comparison, outputs either a switching signal of 0V or a switching signal having the value of the DC voltage provided by the DC voltage supply U5, i.e., in the present case, 5V. This switching signal is passed to an output 50 of the sensor 100.

One advantage of this arrangement is that this switching signal is generated as a function of extremely small changes in the capacitance at the probe electrode. This can be achieved by the sensor of the present invention through the fact that there are no parasitic capacitances acting at the amplifier. To this end, a supply voltage having an AC voltage portion is applied at one of the supply voltage connections of the amplifier, whereas a DC voltage is applied at the other supply voltage connection, since, owing to the design of the amplifier, no parasitic capacitance occurs between this supply voltage connection and the amplifier input.

Thus, it is possible to very reliably detect minimal changes of capacitance caused by an object to be detected.

The invention claimed is:

1. A sensor for detecting an object, comprising:
  a probe electrode for forming a measuring capacitance (C1) with the object to be detected,
  a charge generator for generating an alternating charging voltage (U3), wherein the probe electrode is charged by the alternating charging voltage (U3),
  an amplifier (A) for amplifying an input voltage, the input voltage comprising a voltage across the measuring capacitance (C1), wherein the amplifier (A) includes a first supply voltage connection (A1) and a second supply voltage connection (A2),
  a processing component for processing signals that are outputted at an output of the amplifier (A) to form at least one output signal, and
  at least one sensor output for outputting the at least one output signal, wherein a second supply voltage (U2) in the form of a DC voltage is directly connected to the second supply voltage connection (A2), and a first supply voltage (U1) having an AC voltage portion is directly connected to the first supply voltage connection (A1), wherein the AC voltage portion is generated by a supply voltage generator, wherein the charge generator and the supply voltage generator comprise the same generator and wherein the AC voltage portion of the first supply voltage (U1) is determined by the alternating charging voltage (U3).

2. The sensor as defined in claim 1, wherein the first supply voltage (U1) is additionally provided with a DC voltage portion (U5) which, in order to operate the amplifier (A) within its operating range, differs from ground potential.

3. The sensor as defined in claim 1, wherein with reference to ground potential, the voltage amplitude applied by the charging voltage (U3) at the probe electrode deviates by a maximum of 20% from, or more particularly is equal to, the amplitude of the AC voltage portion of the first supply voltage (U1).

4. The sensor as defined in claim 1, wherein with reference to ground potential, the voltage amplitude applied by the charging voltage (U3) at the probe electrode is equal to the amplitude of the AC voltage portion of the first supply voltage (U1).

5. The sensor as defined in claim 1, wherein the second supply voltage (U2) present at the second supply voltage connection (A2) is equal to ground potential.

6. The sensor as defined in claim 5, wherein in order to inhibit a parasitic capacitance (CP2) between the second supply voltage connection (A2) and the amplifier input (A3), the amplifier (A) is a transistor amplifier in common collector circuit, more particularly a common collector Darlington circuit or a complementary common collector Darlington circuit.

7. The sensor as defined in claim 5, wherein in order to inhibit a parasitic capacitance (CP2) between the second supply voltage connection (A2) and the amplifier input (A3), the amplifier (A) is one of a common collector Darlington circuit and a complementary common collector Darlington circuit.

8. The sensor as defined in claim 1, wherein the amplifier (A) has an AC voltage gain of 1 for inhibiting disruptive effects of a parasitic capacitance (CP3) between the output and input of the amplifier (A).

9. The sensor as defined in claim 1, wherein the processing component comprises a rectifier circuit for rectifying a signal at the output of the amplifier (A) and wherein the first supply voltage (U1) of the amplifier (A) serves as the reference potential of the rectifier circuit.

10. The sensor as defined in claim 9, wherein the rectifier circuit is a synchronous rectifier and wherein the synchronous rectifier is controlled by the changing voltage (U3).

11. The sensor as defined in claim 9, wherein the processing component is configured to generate an analog output signal or a switching signal based on voltage means values (MP1, MP2) which are outputted from the rectifier circuit, and wherein at least one of the analog output signal and the switching signal are outputted at the sensor output.

12. The sensor as defined in claim 9, wherein the processing component comprises a first comparator (K1) for comparing the output signal of the rectifier circuit with a threshold value and wherein an output signal of the first comparator (K1) is outputted as a switching signal.

13. The sensor as defined in claim 9, wherein the processing component comprises a first comparator (K1) for comparing the output signal of the rectifier circuit with a threshold value and wherein an output signal of the first comparator (K1) is outputted as a switching signal to the sensor output.

14. The sensor as defined in claim 9, wherein the processing component comprises a first comparator (K1) for comparing the output signal of the rectifier circuit with a threshold value, wherein an output signal of the first comparator (K1) is outputting as a switching signal, wherein the reference potential for the output of the first comparator (K1) is the first supply voltage (U1), wherein a second comparator (K2) is available, for the output of which the ground potential is the reference potential, and wherein a signal transmission circuit transmits the switching signal of the first comparator (K1) to the second comparator (K2), wherein the signal transmission circuit relates the switching signal of the first comparator (K1)to a DC voltage potential so that the output signal of the second comparator (K2) does not alternate at the frequency of the charging voltage (U3).

15. A method for detecting an object,
wherein a measuring capacitance (C1) is formed by means of a probe electrode and the object to be detected,
wherein the probe electrode is charged by means of an alternating charging voltage (U3) generated by a charge generator,
wherein a voltage across the measuring capacitance (C1) is provided to an input of an amplifier (A), the amplifier amplifying the input voltage,
wherein signals outputted at an output of the amplifier (A) are processed to form at least one output signal and wherein the at least one output signal is outputted,
wherein a second supply voltage (U2) in the form of a DC voltage is directly connected to a second supply voltage connection (A2) of the amplifier (A) and wherein a first supply voltage (U1) having an AC voltage portion is directly connected to a first supply voltage connection (A1) of the amplifier (A), wherein the AC voltage portion is generated by a supply voltage generator,
wherein the charge generator and the supply voltage generator comprise the same generator and wherein the AC voltage portion of the first supply voltage (U1) is determined by the alternating charging voltage (U3).

16. The method as defined in claim 15,
wherein
each of the oscillation periods of the alternating charging voltage (U3) comprises a first and a second charge phase (P1, P2), and
wherein for each of the two charge phases (P1, P2) a mean voltage value (MP1, MP2) is outputted by a rectifier circuit, or wherein an output signal derived from the two mean voltage values (MP1, MP2) relating to the two charge phases (P1, P2) or from one mean voltage value (MP1, MP2) relating to one of the two charge phases (P1, P2) is outputted by a rectifier circuit.

17. The method as defined in claim 15,
wherein
in order to mask the interference signals, the alternating charging voltage (U3) is generated with at least one of varying frequencies and/or phases.

18. The method as defined in claim 16,
wherein
in order to mask the interference signals, the alternating charging voltage (U3) is generated with at least one of varying frequencies and/or phases.

19. The method as defined in claim 15,
which is carried out by means of a sensor for detecting the object, the sensor comprising:

the probe electrode for forming the measuring capacitance (C1) with the object to be detected, the charge generator for generating the alternating charging voltage (U3), wherein the probe electrode is charged by means of the alternating charging voltage (U3), the amplifier (A) for amplifying the input voltage, the input voltage comprising the voltage across the measuring capacitance (C1), wherein the amplifier (A) includes the first supply voltage connection (A1) and the second supply voltage connection (A2), the processing component for processing signals that are outputted at the output of the amplifier (A) to form the at least one output signal, and at least one sensor output for outputting the at least one output signal, wherein the second supply voltage (U2) in the form of a DC voltage is directly connected to the second supply voltage connection (A2), and wherein the first supply voltage (U1) having an AC voltage portion is directly connected to the first supply voltage connection (A1), wherein the AC voltage portion is generated by the supply voltage generator.

* * * * *